United States Patent [19]
Pace et al.

[11] Patent Number: 5,740,524
[45] Date of Patent: *Apr. 14, 1998

[54] FEED-FORWARD RSSI ASSISTED RADIO FREQUENCY AMPLIFIER POWER CONTROL

[75] Inventors: Gary Lee Pace, Boca Raton, Fla.; Walter Grandfield, Chandler, Ariz.; Wei Len Tan, Leonie Condotel, Singapore

[73] Assignee: Motorola, Inc., Schaumburg, Ill.

[*] Notice: The term of this patent shall not extend beyond the expiration date of Pat. No. 5,564,092.

[21] Appl. No.: 572,140

[22] Filed: Dec. 14, 1995

Related U.S. Application Data

[63] Continuation-in-part of Ser. No. 334,092, Nov. 4, 1994, Pat. No. 5,564,092.
[51] Int. Cl.⁶ .................................................. H04B 1/06
[52] U.S. Cl. ........................... 455/232.1; 455/235.1; 455/246.1; 330/136
[58] Field of Search .................. 455/38.3, 226.2, 455/234.1, 235.1, 250.1, 247.1, 232.1, 343; 340/825.44, 311; 330/134, 136, 145, 129, 279, 284

[56] References Cited

U.S. PATENT DOCUMENTS

| | | | |
|---|---|---|---|
| 3,918,003 | 11/1975 | Seidel | 330/145 |
| 4,169,219 | 9/1979 | Beard | 455/235.1 |
| 4,811,423 | 3/1989 | Eastmond | 455/235.1 |
| 5,001,776 | 3/1991 | Clark | 455/226 |
| 5,208,549 | 5/1993 | Andoh | 330/136 |
| 5,359,607 | 10/1994 | Nguyen et al. | 455/226.1 |
| 5,369,759 | 11/1994 | Tsunoda | 455/234.1 |
| 5,535,444 | 7/1996 | Grandfield | 455/232.1 |
| 5,564,092 | 10/1996 | Grandfield et al. | 455/232.1 |

*Primary Examiner*—Edward F. Urban
*Attorney, Agent, or Firm*—Gregg Rasor

[57] ABSTRACT

A selective call receiver (100) includes a radio frequency amplifier (202) having an output power level that is controllable. A radio frequency level sensor (500) generates a sensor output signal in response to an input signal level received at the radio frequency amplifier (202). The receiver also includes a RSSI signal (208) that indicates a relative strength of an on-channel signal received at the radio frequency amplifier and recovered by the selective call receiver. The amplifier output power level adjustment circuit that operates to adjust a power gain of the radio frequency amplifier (202) in an unconditionally stable feed-forward manner based on the sensor output signal and the RSSI signal, such that the output power level remains substantially constant when the input signal level sensed by the radio frequency level sensor (500) substantially reaches or exceeds a first predetermined signal overload level or the received on-channel signal substantially reaches or exceeds a second predetermined signal level.

19 Claims, 5 Drawing Sheets

FEED-FORWARD RSSI ASSISTED RADIO FREQUENCY AMPLIFIER POWER CONTROL

This is a continuation-in-part of application Ser. No. 08/334,092 filed Nov. 4, 1994 now U.S. Pat. No. 5,564,092.

FIELD OF THE INVENTION

This invention relates in general to amplifier power control circuits and more particularly to an amplifier power control circuit having both a feed-forward and a feed-back signal gain control for use in conjunction with a radio frequency amplifier in a selective call receiver.

BACKGROUND OF THE INVENTION

Conventional selective call receivers operate to receive radio frequency signals using a radio frequency amplifier that is typically tuned for optimal performance over a narrow operating frequency band. In order to achieve certain objectives such as extended battery life and high profitability, a manufacturer will typically impose power and cost constraints that result in performance trade-offs.

As an example of a performance trade-off necessary in low power receiver design, a designer, given the goal of optimizing a radio frequency amplifier for low power consumption and good sensitivity over a relatively narrow frequency band, might choose to sacrifice dynamic range or intermodulation distortion characteristics. This choice would possibly lead to an amplifier having poor distortion characteristics at high input signal levels. Given that most conventional low power radio frequency amplifiers are of either a common emitter neutralized or a cascode topology, each of limited dynamic range, the choice of improving sensitivity by several decibels over a similar improvement in distortion characteristics would probably be a wise one. The preceding choice can be justified since the aforementioned topologies are well suited for amplifying a desired signal in environments where interfering signal levels are substantially below a desired signal level. However, in an environment where in addition to the desired signal, undesired narrow or broadband interference is impressed upon the amplifier, the desired signal will not be adequately amplified, thus degrading the receiver's sensitivity.

The degradation in sensitivity previously mentioned is due to the amplifier responding to the undesired signals falling within its operating bandwidth. More particularly, any number of signals falling within the operating bandwidth of an amplifier of finite dynamic range will cause the amplifier to generate an amplified response. The amplified response will correspond substantially in proportion with each of the input signals, but only to the point where the amplifier has sufficient power to respond in a linear fashion to said signals. When the amplifier becomes overloaded with respect to the desired signal, the result is a distorted, non-linear amplified output signal. Essentially, a portion of the total energy available for amplification of the desired signal is "consumed" by the amplifier when it responds to amplify any interfering signals. In an ideal amplifier, this problem never occurs, but when constrained as discussed before, a designer will be eternally confronted with the choice between designing an amplifier having high gain, low noise figure, and poor high level distortion performance; or an amplifier having low gain, medium noise figure, and improved high level distortion performance.

Thus, what is needed is an apparatus, that in conjunction with a radio frequency receiver and amplifier, yields a receiving system having a relatively constant receiver sensitivity over widely varying interfering signal conditions. Moreover, the apparatus must operate in a power conserving mode while maintaining an amplified signal gain appropriate for the impressed signal conditions. As a result of controlling the signal gain, the distortion characteristics of the radio frequency receiver and amplifier are improved.

SUMMARY OF THE INVENTION

Briefly, according to the invention, there is provided a selective call receiver including a radio frequency amplifier having an output power level that is controllable in an unconditionally stable manner. A selective call receiver includes a radio frequency amplifier having an output power level that is controllable. A radio frequency level sensor generates a sensor output signal in response to an input signal level received at the radio frequency amplifier. The receiver also includes a RSSI signal that indicates a relative strength of an on-channel signal received at the radio frequency amplifier and recovered by the selective call receiver. The amplifier output power level adjustment circuit that operates to adjust a power gain of the radio frequency amplifier in an unconditionally stable feed-forward manner based on the sensor output signal and the RSSI signal, such that the output power level remains substantially constant when the input signal level sensed by the radio frequency level sensor substantially reaches or exceeds a first predetermined signal overload level or the received on-channel signal substantially reaches or exceeds a second predetermined signal level.

DESCRIPTION OF A PREFERRED EMBODIMENT

Figure 1:
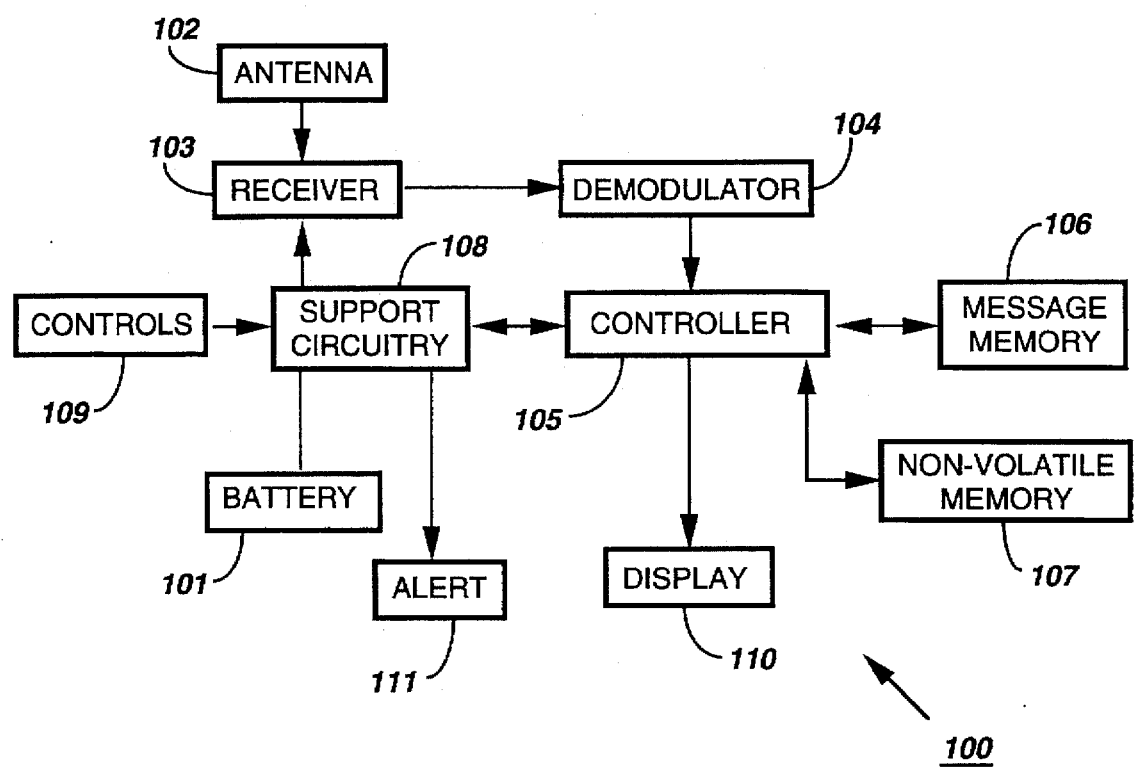
FIG. 1 is a block diagram of a selective call receiver suitable for use with the present invention.

Referring to FIG. 1, a battery 101 powered selective call receiver 100 operates to receive a signal via an antenna 102. A receiver 103 couples a received signal to a demodulator 104, which recovers any information present using conventional techniques. The recovered information signal is coupled to a controller 105 that interprets and decodes the information contained therein. In a preferred embodiment, the controller 105 comprises a microprocessor having a signal processor (e.g., a decoder) implemented in both hardware and software.

The recovered information is checked by the decoder, which implements the signal processor for correlating a recovered address with a predetermined address. The non-volatile memory 107 typically has a plurality of registers for storing the predetermined address and a plurality of configuration words that characterize the operation of the selective call receiver. In determining the selection of the selective call receiver, a correlation is performed between a recovered address contained within the information signal with a predetermined address corresponding to the selective call receiver. When the addresses substantially correlate, a detect is generated indicating selection of the selective call receiver and the controller 105 couples decoded message information to the message memory 106. In accordance with the recovered information, settings associated with the user controls 109, and detection, the support circuit 108 operates to process at least a portion of the message information for presentation, such as by a display 110, and may signal the user via an audible or tactile alert 111 that a message has been received. The user may view the information presented on the display 110 by activating the appropriate controls 109.

The support circuit 108 preferably comprises a conventional signal multiplexing integrated circuit, a voltage regulator that may supply a regulated voltage to portions of the support circuit 108, receiver 103, demodulator 104, or other selective call receiver components. Alternatively, the support circuit may be integrally coupled with the controller (e.g., a microcontroller includes features such as A/D, D/A converters, programmable I/O ports, a control buss, etc.). Furthermore, the support circuit 108 may include environmental sensing circuitry such as for light or temperature conditions, audio power amplifier circuitry, control interface circuitry, a clock frequency synthesizer, and display illumination circuitry. These elements are conventionally assembled to provide the information display receiver as requested by a customer.

Figure 2:
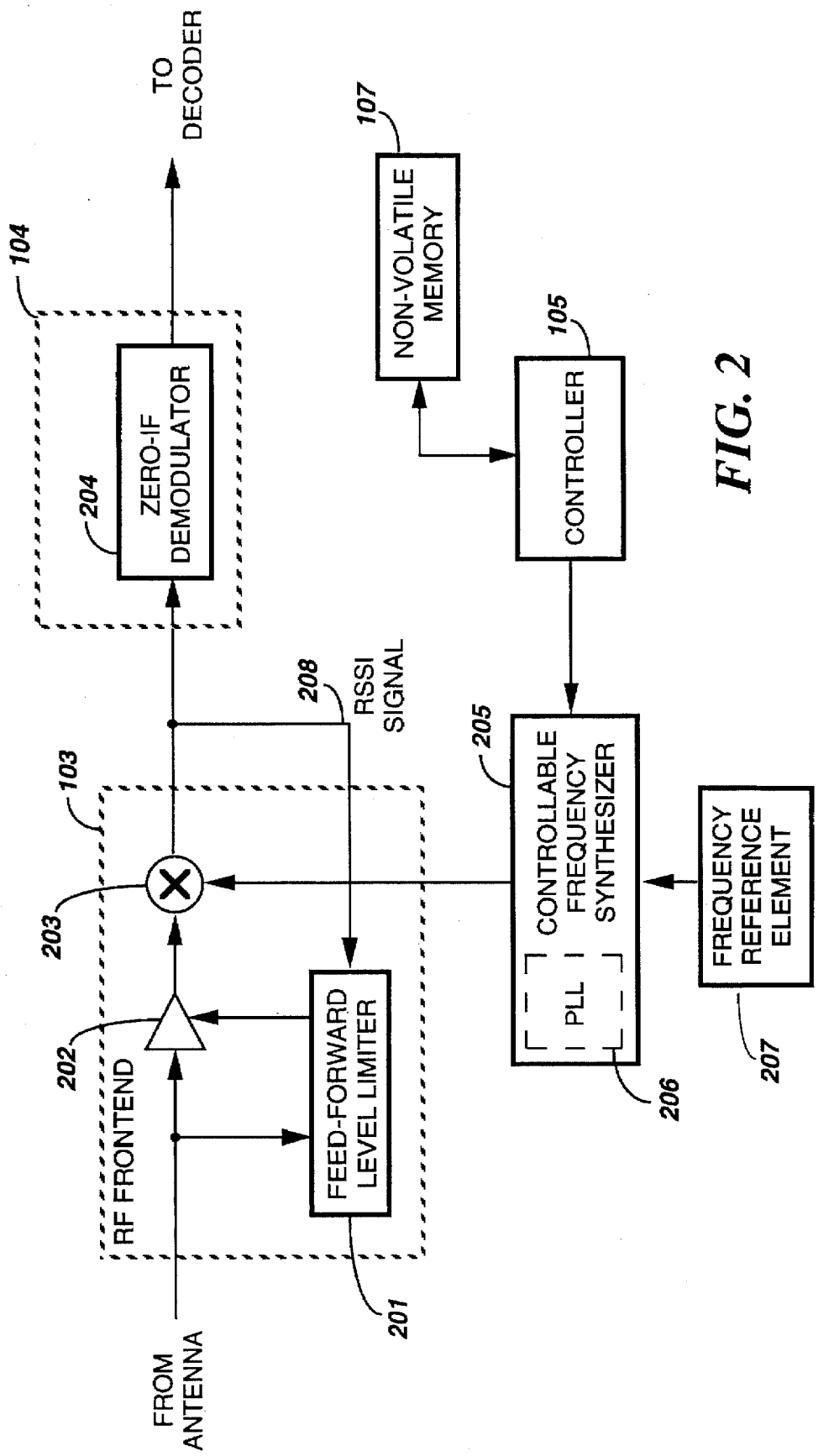
FIG. 2 is a partial block diagram of the selective call receiver depicted in FIG. 1 implementing a zero-IF receiver in accordance with a first embodiment of the present invention.

Referring to FIG. 2, the partial block diagram illustrates a zero-IF receiver implemented in the selective call receiver depicted in FIG. 1, in accordance with a first embodiment of the present invention.

A received signal is coupled from the antenna 102 (not shown in this figure) to an RF amplifier 202. The RF amplifier 202 has a controllable output power that is determined at least in part by a detected amplitude associated with the received signal. In response to the detected amplitude exceeding a first predetermined signal overload level, a feed-forward level limiter 201 couples a control signal to the RF amplifier 202, thereby adjusting the controllable output power of the RF amplifier 202 and preventing distortion due to high input signal levels. The first predetermined signal overload level should be chosen such that the desired signal is amplified with a signal to noise or carrier to noise ratio yielding a signal quality acceptable to accomplish conventional, error free decoding of wired of wireless signalling schemes. Noise in this case includes any unwanted or undesired signals including what is commonly known in the art as thermal noise, shot noise, 1/f noise, or any other noise source capable of creating electrical interference. In this fashion, the received signal, which may include a modulated carrier signal, will be cleanly amplified and in good condition for later decoding.

More particularly, in a selective call receiver, there is a received signal threshold above which distortion occurs in the receiver. When an RF signal received by the antenna 102 meets or exceeds this threshold, the RF amplifier 202 responds by attempting to linearly reproduce the signal including and gain added by the amplifier. However, since the RF amplifier 202 has effectively run out of linear dynamic range, it amplifies many of the signals presented at its input in a non-linear fashion, thus potentially creating severe distortion products in the output signal. Accordingly, the first predetermined signal overload level should be chosen to correspond with a field strength received by the antenna 102, that under typical signal and environmental conditions yields linear amplification of all signals impressed on the RF amplifier 202. The first predetermined signal overload level would then be "programmed" into the feed-forward level limiter 201 such that any signals meeting or exceeding this threshold would trigger the feed-forward level limiter 201 to begin reducing the gain of the RF amplifier 202. Programming, as mentioned above and discussed later, is accomplished by selecting an area ratio of at least two transistors (see FIGS. 5 and 7 and their accompanying discussion to follow).

Similarly, a second received signal threshold should be selected based on some figure of merit relating to a receiver IF response that is substantially certain to be the desired signal, including any modulation contained therein. This may be accomplished by using the RSSI signal 208 since the RSSI signal 208 represents the power received in the noise bandwidth of the receiver. More specifically, a second predetermined signal level corresponding with the second received signal threshold is chosen at a lower input power level than the input power level corresponding with the first predetermined signal overload level. For example, a typical first predetermined signal overload level might correspond with a field strength of 1000 µV/m. Having selected the first predetermined signal overload level, a designer might select the 20 dB IF rise point (determined using the receiver's RSSI signal 208) as the second received signal threshold, roughly corresponding to a field strength of approximately 10 µV/m in this example. Rise, as used in the art of receiver design typically refers to the power measured in the IF bandwidth with reference to the noise floor of a receiver. From the measured rise, a rough estimate of signal to noise can be made. It is generally accepted that a signal to noise ratio of 10 dB or better in a selective signalling system is adequate for the reliable decoding of recovered data. From this signal to noise estimate corresponding to, say 10 dB S/N, the second predetermined signal level is chosen. Now using the second predetermined signal level as the threshold for operation of the RSSI signal 208 control of the RF amplifier's 202 gain, one can allow the receiver to maintain an acceptable signal to noise ratio over an extremely wide range of input signal levels, accounting for both in-band desired responses and out-of-band interfering sources. Note that the preceding choices yield a minimum control window increase of 40 dB over the receiver's total dynamic range. This is significant since most high level distortion prevention systems operate over a dynamic range of only 20 to 30 dB. In this case illustrated above, the minimum dynamic range over which adjustment is available is 60 to 70 dB. By careful selection of the first predetermined signal overload level and second predetermined signal level, receiver systems using the instant invention can control distortion over a dynamic range exceeding 100 dB.

After initial amplification, the received signal is converted down to baseband using a conventional frequency converter 203. The resulting baseband signal is subsequently demodulated using a conventional zero-if demodulator 204 such as a differentiate and cross-multiply topology or the like. The conversion is accomplished by mixing the received signal with a local oscillator signal provided by a controllable frequency synthesizer 205 or a conventional crystal controlled oscillator (not shown). In the first embodiment, the controllable frequency synthesizer 205 comprises a programmable phase lock loop synthesizer 206, using for example, at least one of a conventional divide-by-N prescaler, a dual modulus divider, or a fractional N division scheme such that the local oscillator signal frequency may be stepped in coarse or fine increments. The controllable frequency synthesizer 205 may also be used to synthesize any number of frequencies required to clock digital logic circuitry associated with other of the components comprising the selective call receiver (e.g., the decoder).

The controllable frequency synthesizer 205 is responsive to a controller module (e.g., an MC68HC05C4 manufactured by Motorola, Inc.) 105, that performs a sequence of decisions and controlling actions, as will be subsequently more fully discussed. The controller module 105 adjusts the local oscillator signal frequency by writing a control word (e.g., a divide factor) into the controllable frequency synthesizer 205, thereby programming the phase-locked loop 206 to a target frequency. The control word is derived from a relation between the frequency reference element 207 and the desired output frequency. The relation may be predetermined and its parameters stored in the non-volatile memory 107. The non-volatile memory 107 may then be accessed by the controller 105 to program an output frequency of the programmable phase lock loop synthesizer 206.

As an example, consider the case where a secondary (undesired) radio frequency signal is received by the antenna 102 and impressed on the RF amplifier 202 along with a desired signal. In this case, high level or intermodulation distortion (IMD) may result. The preceding terms for distortion, even though different, are used interchangeably to illustrate the following problems of dealing with amplifier related nonlinear distortion. Since the level of distortion produced by a device is somewhat inherent to the specific non-linearities associated with the device, system gain and operating characteristics may be controlled by detecting the input level (at the input of the RF amp 202) and adjusting the current supplied to or output loading of the RF amplifier 202. In response to detecting the input level, the gain of the RF amplifier is effectively adjusted by either method to achieve and maintain substantially constant power output thereof in amplifying the desired signal. In the case of an active device such as an amplifier, reducing the input level of the unwanted signal typically results in a corresponding decrease in the distortion present in the desired received signal.

As discussed earlier, similar adjustment of the gain or loading of the RF amplifier 202 may be accomplished using an RSSI (relative signal strength indicator) signal 208. However in a zero-IF receiver, an alternative RSSI signal 208 may be derived from the baseband I and Q components resulting from a typical zero-IF conversion of a quadrature based information signal. By combining the broadband input signal detection provided by the feed-forward level limiter 201 with the low-RF level detection capability of an RSSI based narrowband IF signal level detector, a more precise and definitely more reliable adjustment of amplifier power can be effected.

The present invention is particularly well suited for minimizing distortion while operating in the feed-forward adjustment mode because of the inherent stability of a feed-forward control system. By adjusting the output power capability of the RF amplifier 202 in response to the received signal amplitude detected the input of RF amplifier 202, feed-forward adjustment is accomplished in an unconditionally stable manner. Moreover, this operation greatly reduces the complexity associated with prior art gain control systems such as those operating with either positive or negative feedback, since no compensation is required to achieve stability in the present invention. Even with the addition of the RSSI signal 208 based feedback control, the system remains stable since the majority of the power control is derived from the feed-forward level limiter, and the RSSI signal 208 serves mostly to supplant linear operation over a wider dynamic range.

Any number of methods can be applied to reduce the level of the unwanted signal presented to the receiver 103. An alternative method for controlling distortion in a conversion section such as the baseband converter is disclosed in U.S. Pat. No. 5,001,776 entitled: "COMMUNICATION SYSTEM WITH ADAPTIVE TRANSCEIVERS TO CONTROL INTERMODULATION DISTORTION", issued to Edward T. Clark and assigned to Motorola, Inc., the teachings of which are hereby incorporated by reference. This United States Patent discusses in a first embodiment, an apparatus that measures a quality of a received signal. In response to the quality being less than a predetermined quality factor, an adjustment is made in the drive level of a local oscillator signal that is used for effecting a conversion of a radio frequency signal from a first frequency to a second frequency. The Clark patent further discusses an optional control mechanism that regulates the gain of a radio frequency amplifier to prevent signal overload. Further, Clark discusses the exchange of coded responses that control a transmission power of a unit sending the radio frequency signal. In a second embodiment, Clark discusses an RSSI detector that determines a relative signal strength of the received signal. A controller then adapts the radio frequency amplifier's gain and local oscillator drive level in response to the detected signal quality and the relative signal strength.

As can be appreciated by one of ordinary skill in the art, the methods and apparatus disclosed in Clark may be further improved by adding the advantages of the instant invention.

Figure 3:
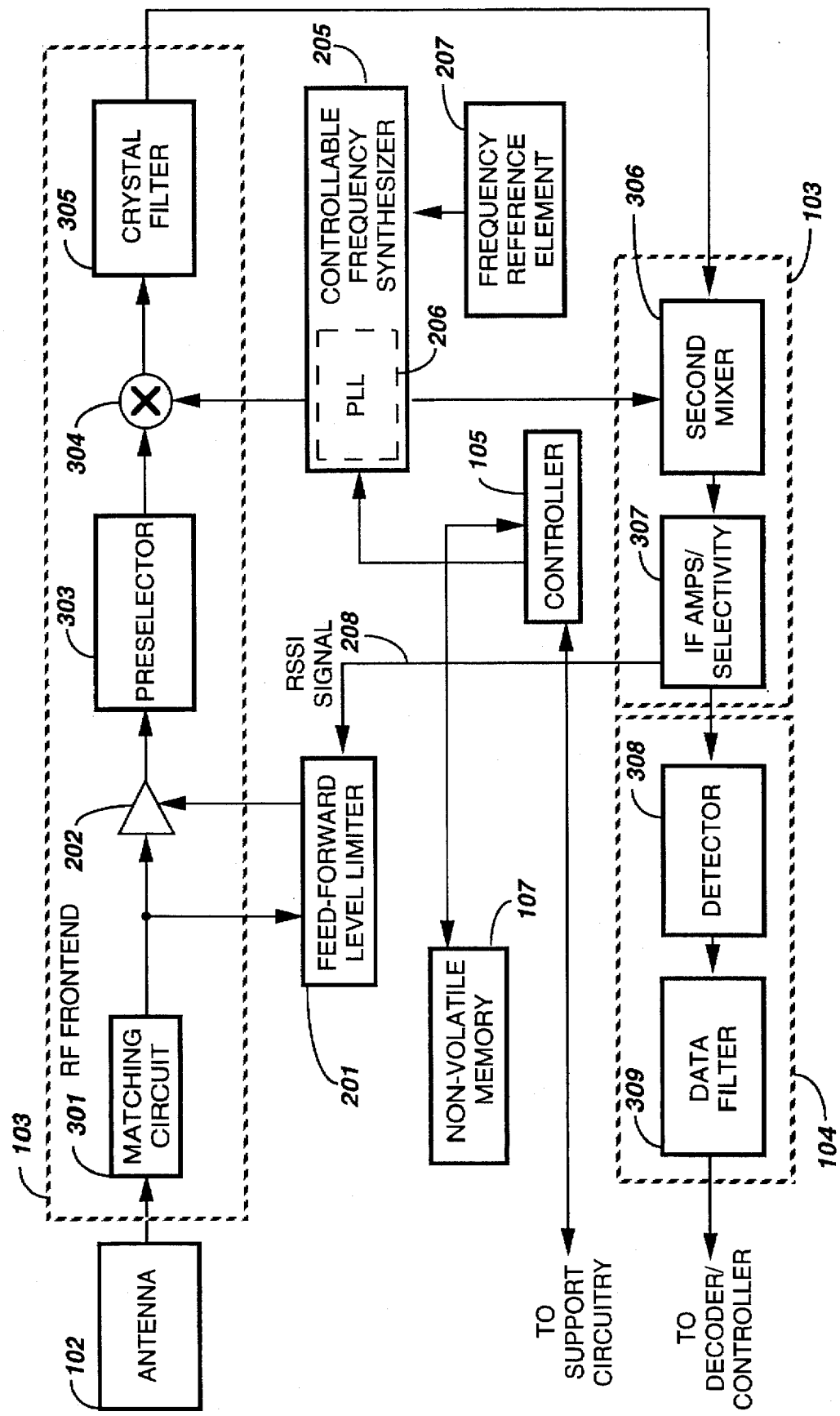
FIG. 3 is a partial block diagram of the selective call receiver depicted in FIG. 1 implementing a dual conversion receiver in accordance with an alternate embodiment of the invention.

Referring to FIG. 3, the partial block diagram illustrates a frequency synthesized dual conversion receiver implemented in the selective call receiver depicted in FIG. 1, in accordance with an alternate embodiment of the invention.

A received signal is coupled from the antenna 102 to the RF amplifier 202 via a matching circuit 301. The RF amplifier 202 has a controllable output power that is determined at least in part by at least one detected amplitude associated with the received signal. Additionally, the RSSI signal 208 may serve to control the gain of the RF amplifier 202 at lower received signal levels, thus extending the dynamic range of the complete receiver system. In response to the detected amplitude exceeding the first predetermined signal overload level, the feed-forward level limiter 201 couples a control signal to the RF amplifier 202, thereby adjusting the controllable output power of the RF amplifier 202 and preventing distortion due to high input signal levels. As with the example in FIG. 2, the predetermined amplitude should be chosen such that the desired signal is amplified with a signal to noise or carrier to noise ratio yielding a signal quality acceptable to accomplish conventional, error free decoding of wired of wireless signalling schemes. In this fashion, the received signal, which may include a modulated carrier signal, will be cleanly amplified and in good condition for later decoding.

This exemplary dual-conversion receiver 103 "RF front end" 301, 202, 303, 304, 305 is responsive to a transmitted signal that is received and coupled in via an antenna 102, as is commonly known in the art. The received signal from the antenna 102 may be optionally preconditioned using known techniques to provide an optimum signal level within a predetermined frequency bandwidth that is coupled to a first mixer 304.

The optional preconditioning of the received signal is usually performed by a matching circuit 301, a radio frequency amplifier 202, and a preselector filtering circuit 303, the design and function of these circuits being generally well known in the art. The matching circuit 301 matches the antenna 102 impedance characteristics to the RF amplifier 202. Preferably, the matching circuit is designed to provide the RF amplifier 202 with an optimum noise match (minimum noise figure) and low insertion loss, thereby optimally delivering the received signal power from the antenna 102 to the RF amplifier 202. The amplified signal is then coupled to a preselector filtering circuit 303 that accepts a desired signal with minimal attenuation (e.g., within a predetermined frequency band) and attenuates (i.e., rejects) all undesired signals. Consequently, the received signal is preconditioned and coupled to the first signal mixer 304.

The first mixer 304 subsequently mixes the preconditioned received signal with a first local oscillator injection signal provided by the controllable frequency synthesizer 205. The controllable frequency synthesizer has an output frequency derived from the frequency reference element 207. The resulting conversion generates a first intermediate frequency signal that is subsequently coupled to a crystal filter 305 that passes the first intermediate frequency signal and attenuates any undesired signals such as the first mixer image signal and the first local oscillator injection signal.

A second mixer 306 mixes the first intermediate frequency signal with a second local oscillator injection signal provided by the controllable frequency synthesizer 205. The resulting second intermediate frequency signal is typically filtered and amplified (i.e., by an intermediate frequency amplifying and filtering circuit 307) and coupled to the demodulator 104. The demodulator in this embodiment comprises a modulation detector 308 that recovers information (i.e., FSK digital data, audio tones, PSK digital data, SSB, etc.) that is coupled to a decoder via a data filter 309 in a manner well known in the art.

In performing frequency selection, the controller 105 is coupled to the controllable frequency synthesizer 205 including the phase lock loop 206. The controller operates to execute a microcode program that generates a frequency control signal. The frequency control signal serves to program the output frequency of the controllable frequency synthesizer 205 to reflect a frequency error of substantially zero parts per million with respect to a desired operating frequency (e.g., the local oscillator frequency, clock frequency, or the like).

The non-volatile ram (e.g., read only memory, backed-up random access memory, EEPROM, or the like) 107 may provide storage for executable controller instructions, storage for a table representing programmed output frequencies and their corresponding control word(s) (e.g., divide factors), and storage for non-volatile configuration information that may be necessary to perform the decisions and actions in the control process, as will be subsequently more fully discussed.

Figure 4:
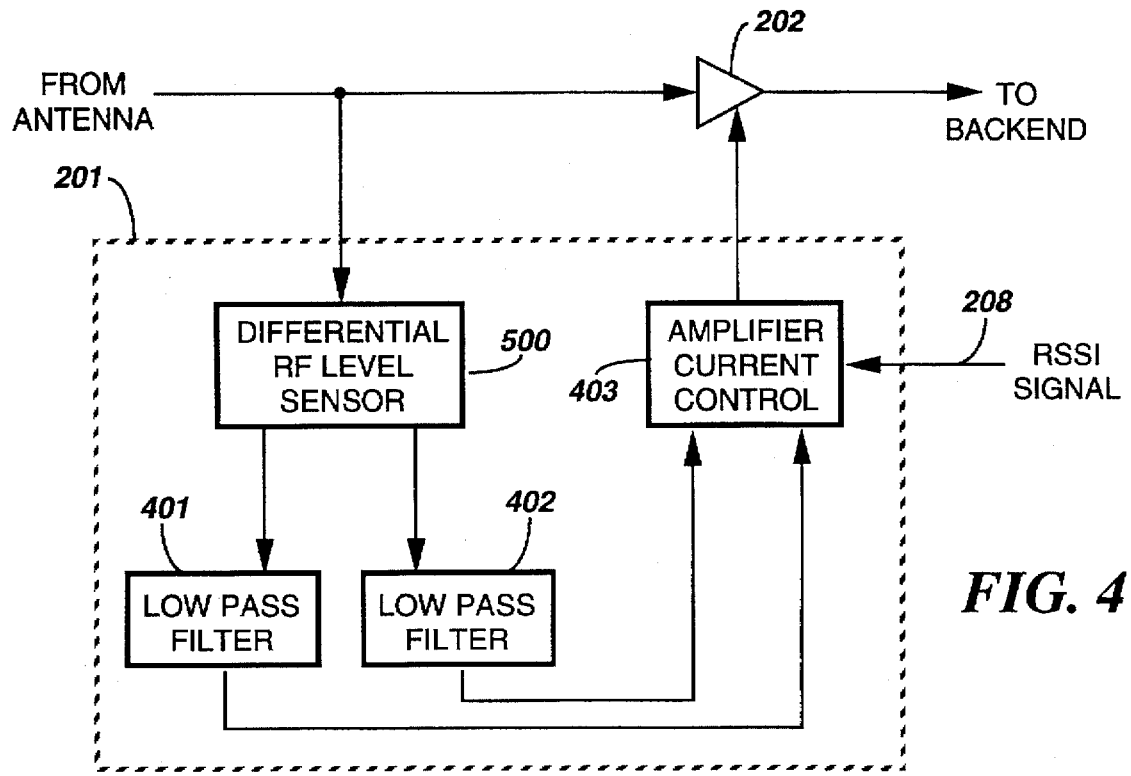
FIG. 4 is a block diagram of a radio frequency amplifier having an output power level that is controllable in accordance with a further embodiment of the present invention.

Referring to FIG. 4, the block diagram illustrates a radio frequency amplifier having an output power level that is controllable in accordance with a further embodiment of the present invention.

When the signal strength from the antenna 102 is below the first predetermined signal level (or overload level) of the receiver, the differential output of the RF level sensor 500 will not reduce the current consumption of the RF amplifier 202. When the signal strength from the antenna exceeds the overload level the differential output of the RF level sensor 500 will change to its alternate asymmetric state. In this state the current consumption and hence the power gain of the RF amplifier 202 is reduced as the antenna signal strength increases. As a result the output power of the RF amplifier 202 will remain relatively constant.

The low-pass filters 401, 402 operate to substantially remove any AC signal components and pass the DC signal component of the RF level sensor 500 output. Operation as such prevents the difference component of two closely spaced frequencies from reaching the amplifier current control 403 and amplitude modulating the RF amplifier 202.

The amplifier current control circuit 403 is implemented using a suitable conventional differential buffer/amplifier or the like. The function of the amplifier current control circuit 403 is to control the power gain of the RF amplifier 202 by regulating the amount of current available to the RF amplifier 202 as a function of detected signal strength. Signal strength may be detected in at least two ways. First, a DC value may be generated by detecting and filtering the output of the RF level sensor 500 with low-pass filters 401, 402. Alternatively, a relative signal strength indication signal (RSSI) generated from an intermediate frequency (IF) detection or the like, may applied either singularly or jointly to the amplifier current control circuit 403. Note that as discussed earlier, a zero-IF receiver having a demodulator with resulting I and Q (in- and quadrature) components, a pseudo RSSI signal may be generated by summing the squared I and Q components ($I^2+Q^2$).

Figure 5:
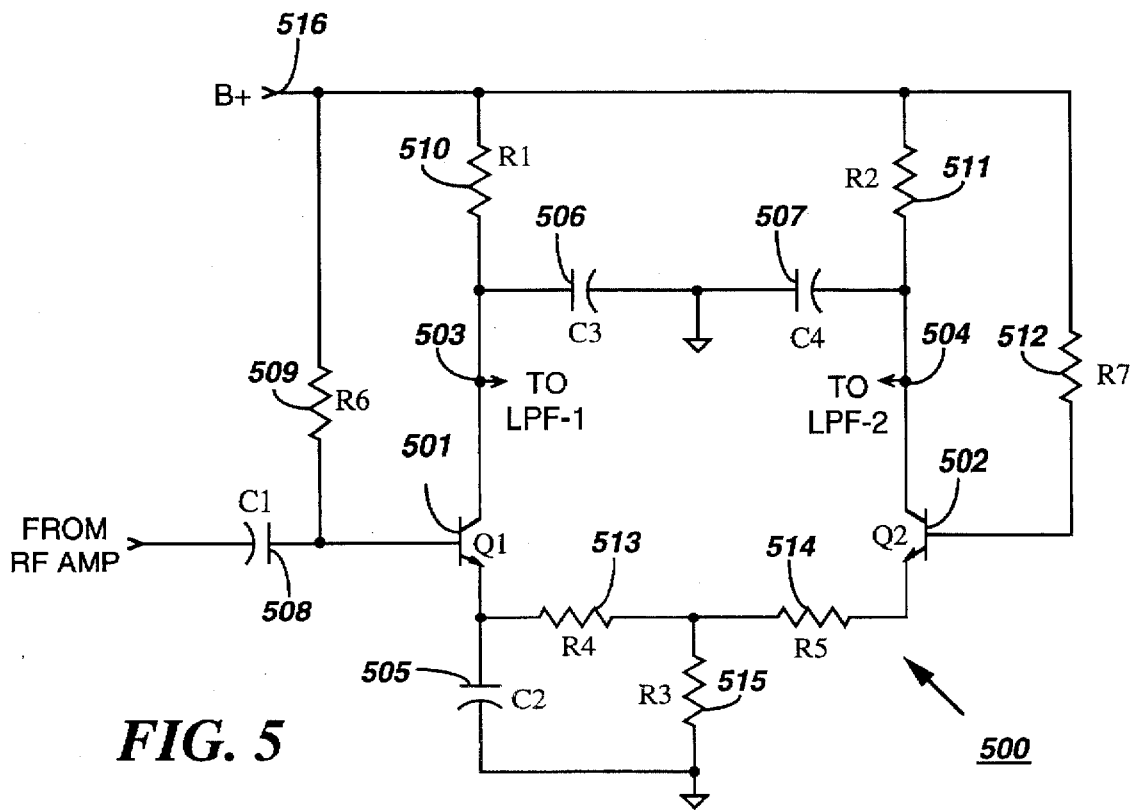
FIG. 5 is a simplified schematic diagram of a differential radio frequency level sensor for use with the radio frequency amplifier in accordance with a further embodiment of the present invention.

Referring to FIG. 5, the simplified schematic diagram illustrates a radio frequency level sensor for use with the radio frequency amplifier in accordance with a further embodiment of the present invention.

The differential RF level sensor 500 is essentially an asymmetrically biased differential amplifier. The area factor of $Q_2$ 502 is designed as being larger than that of $Q_1$ 501. Hence, with no RF voltage present at the base of $Q_1$ 501, terminal LPF-1 503 will be at a higher voltage than terminal LPF-2 504. As the RF voltage at the base of $Q_1$ 501 is increased, the collector current of $Q_1$ 501 will increase due to the "delta current" phenomena. Delta current, which is commonly expressed as a percentage, is the difference between the quiescent DC operating current in each amplifying stage and the operating current with RF impressed upon the stage. The increase in operating current is primarily due to the rectifying and filtering effects of the active device when RF is impressed, e.g., a bipolar transistor has a diode, resistance, and capacitance associated with the device that together function like a circuit that detects an average value of the RF energy as a DC value. Consequently, an effective RF voltage is detected by generating an effective DC value.

The RF voltage necessary to make the collector current of $Q_1$ 501 equal to the collector current of $Q_2$ 502 is determined by the area factor difference between $Q_1$ 501 and $Q_2$ 502. Hence, the larger the area of $Q_2$ 502 is compared to $Q_1$ 501, the larger the RF voltage necessary at the base of $Q_1$ 501 to achieve equal collector currents. As the RF voltage is increased further, the collector current of $Q_1$ 501 will exceed that of $Q_2$ 502 resulting in LPF-2 504 being at a higher potential than LPF-1 503. The resulting differential voltage ($V_{LPF-2}$, $V_{LPF-1}$) is then used to control the gain of the RF amplifier 202 by coupling the filtered differential voltages to the amplifier current control circuit 403.

Concerning the quiescent DC operating point of the differential RF level sensor 500, a supply voltage of substantially one volt DC 516 powers the circuit. Resistors $R_1$ 510, $R_2$ 511, $R_3$ 515, $R_4$ 513, $R_5$ 514, $R_6$ 509, and $R_7$ 512 operate to set the steady state DC bias for proper operation. As with a symmetric differential amplifier, the right and left half components essentially mirror each other's values, except as previously discussed relating to transistors, $Q_1$ 501 and $Q_2$ 502. Capacitor $C_1$ 508 operates as an AC coupling impedance to allow detection of the input signal level received at the radio frequency amplifier 202. Capacitor $C_2$ 505 operates as an RF bypass capacitor, making the performance of the RF level sensor 500 substantially independent of frequency. Capacitors $C_3$ 506 and $C_4$ 507 operate as AC shorts, thus insuring that the RF level sensor has little or no gain at RF (high) frequencies. These capacitors also serve to increase the input impedance seen by the antenna 102 through $Q_1$ 501, thus preventing any unnecessary loading of the antenna 102.

Operationally, the RF voltage at which the differential RF level sensor 500 switches asymmetric states is extremely repeatable. Since the switching threshold is substantially determined by the area ratio of the transistors used to fabricate the differential level sensor, even when the integrated circuit process used to fabricate the components varies, the detection threshold associated with the predetermined amplitude will remain substantially constant and unchanged. Furthermore, since a differential signal is used to control the current and resulting output power of the RF amplifier 202, better repeatability is insured over process and temperature variations.

In summary, the first embodiment described preferably uses a selective call receiver such as illustrated in FIG. 1 including a radio frequency amplifier 202 having an output power level that is controllable. A radio frequency level sensor 500 operates to generate a sensor output signal in response to an input signal level received at the radio frequency amplifier 202. The sensor output signal has a spectral content comprising complex periodic and non-periodic components. This signal is then coupled to at least one filter 401, 402, such as a low-pass filter that operates to condition it such that a filter output or control signal is generated representing an effective value of the received input signal level present at the radio frequency amplifier. Additionally, an RSSI signal may act as a part of the control signal to further enhance operation in environments with high level interfering signals. The control signal(s) are coupled to an amplifier output power level adjustment circuit 403 that operates to adjust a power gain of the radio frequency amplifier 202 in an unconditionally stable feed-forward manner such that the output power level remains substantially constant when a received input signal level sensed by the radio frequency level sensor 500 substantially reaches or exceeds a predetermined signal overload level.

More specifically, the radio frequency level sensor 500 includes a single ended input, differential output amplifier having differential halves. The radio frequency level sensor operates in a first state when the received input signal level coupled from the radio frequency amplifier 202 is below the predetermined signal overload level such that a differential half is biased in a first asymmetric direction resulting in no adjustment of the output power level, thus allowing the output power level to substantially track the received input signal level; and in a second state when the received input signal level substantially reaches or exceeds the predetermined signal overload level such that a differential half is biased in a second asymmetric direction resulting in a differential output signal that effects adjustment of the power gain of the radio frequency amplifier to maintain a substantially constant radio frequency amplifier output power level. Moreover, as earlier discussed the amplifier output power level adjustment circuit 403 may be further responsive to a relative strength indication of a received on-channel signal (shown as the RSSI signal in FIGS. 2, 3, 4, 6, and 7), the amplifier output power level adjustment circuit operating to adjust the power gain of the radio frequency amplifier 202 such that the output power level remains substantially constant when the received on-channel signal substantially reaches or exceeds a predetermined signal overload level.

Finally, for matters of convenience, the radio frequency amplifier 202, the radio frequency level sensor 500, the at least one filter 401, 402, and the amplifier output power level adjustment circuit 403 may be fabricated in a single integrated circuit.

As may be discerned by one of ordinary skill in the art, minor variations from the particular disclosed embodiments are possible that would allow one to achieve the same end using a different means. Examples of such variations would be integrating only a portion of the disclosed circuit in a single integrated circuit chip, or purposefully separating certain components due to design of practical considerations such as radio frequency interference of the like. Moreover, the receiving, demodulating, and decoding techniques illustrated are exemplary in nature and should in no way be taken to preclude the inclusion of techniques such as non-conventional modulation and signalling schemes like spread spectrum, or the use of digital selectivity, detection, and decoding methods.

Figure 6:
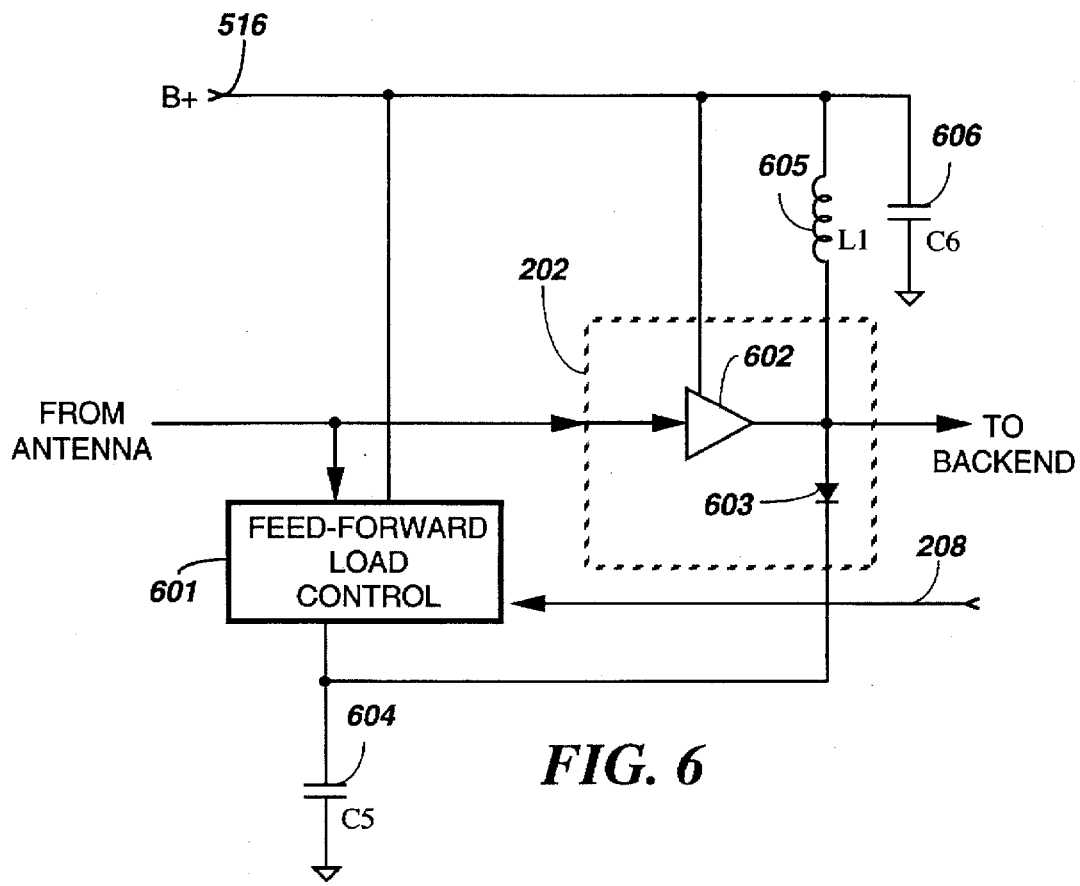
FIG. 6 is a block diagram of a radio frequency amplifier having an output power level that is controllable in accordance with a further embodiment of the present invention.

Referring to FIG. 6, the block diagram illustrates a radio frequency amplifier 202 having an output power level that is controllable in accordance with a further embodiment of the present invention.

When the signal strength from the antenna 102 is below the predetermined signal overload level of the receiver, the output of the feed-forward load control 601 will not conduct any current through a loading diode 603, thus allowing the RF amplifier 202 to operate at its nominal gain. When the signal strength detected at the RF amplifier 202 input exceeds the overload level, the feed-forward load control 601 begins conducting current through the loading diode 603, thus effectively reducing a gain associated with the RF amplifier 202. In this state, as the received signal strength increases, the feed-forward load control 601 increases the current flowing through the loading diode 603, resulting in a corresponding decrease in the effective power gain of the RF amplifier 202. The overall result is that the output power of the RF amplifier 202 will remain relatively constant over wide variations of input signal levels.

More particularly, RF amplifier 202 comprises a conventional radio frequency amplifier 602 such as a narrow-band neutralized, wide-band cascode, bipolar or field effect transistor amplifier or the like. In this particular embodiment, the radio frequency amplifier 602 is designed to operate down to B+ voltages 516 below 1 volt DC. Bias is provided to the loading diode 603 via RF choke 605. The supply voltage is further filtered by capacitors $C_5$ 604 and $C_6$ 606 which serve as AC shorts at the radio frequency amplifier's 602 operating frequency.

The feed-forward load control 601 circuit is implemented using a suitable integrated semiconductor process such as an RF bipolar, BiCMOS (a combination bipolar and CMOS process) process or the like. The function of the feed-forward load control 601 circuit is in response to a detected RF level present at the input of the RF amplifier 202, controlling the maximum power gain of the RF amplifier 202 by regulating the amount of current available to the loading diode 603 as a function of detected signal strength. Note that as with the prior embodiment, the RSSI signal 208 may be combined with the detected input power to more fully control the maximum power gain of the RF amplifier 202. Additionally, the feed-forward load control 601 circuit may be interchanged with the feed-forward level limiter 201 shown in FIGS. 2 and 3 without altering the advantages realized by the feed-forward RF signal detection and output power control system. More particularly, the use of a diode load 603 to control the power gain of the RF amplifier block 201 accomplishes the same end as controlling the bias supplied to an RF amplifier to adjust the power gain, as discussed in reference to FIGS. 4 and 5. Both of the disclosed apparatus accomplish the same end (amplifier output power and distortion control) using different means.

Figure 7:
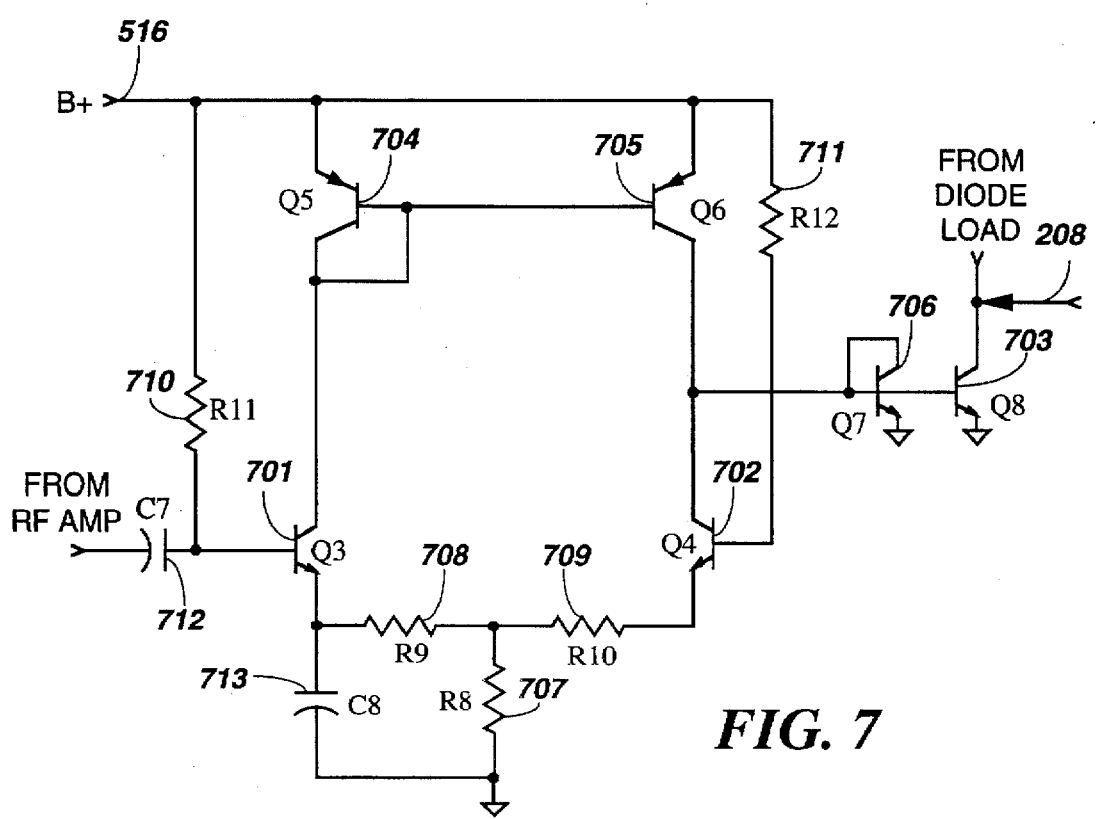
FIG. 7 is a simplified schematic diagram of a feed-forward load control for use with the radio frequency amplifier in accordance with a further embodiment of the present invention.

Referring to FIG. 7, the simplified schematic diagram illustrates a feed-forward load control 201 for use with the radio frequency amplifier 202 in accordance with a further embodiment of the present invention.

Operationally, the RF voltage at which the feed-forward load control 601 circuit activates is extremely repeatable. Since the activation threshold is substantially determined by the area ratio of the transistors $Q_3$ 701 and $Q_4$ 702 used to fabricate a differential level sensor, even when the integrated circuit process used to fabricate the components varies, the activation threshold associated with the predetermined amplitude will remain substantially constant and unchanged. Furthermore, since a differential signal is used to control the current and resulting output power of the RF amplifier 202, better repeatability is insured over process and temperature variations.

The feed-forward load control 601 circuit uses a differential RF level sensor that is essentially an asymmetrically biased differential amplifier. The area factor of $Q_4$ 702 is designed as being larger than that of $Q_3$ 701. Hence, with no RF voltage present at the base of $Q_3$ 701, $Q_8$ 703 will not sink any current through the loading diode 603. As the RF voltage at the base of $Q_3$ 701 is increased, the collector current of $Q_3$ 701 will increase due to the "delta current" phenomena. As before, delta current is the difference between the quiescent DC operating current in each amplifying stage and the operating current with RF impressed upon the stage. An effective RF voltage is detected as delta current in the transistor amplifier which generates an effective shift in its quiescent DC operating point.

The RF voltage necessary to make the collector current of $Q_3$ 701 equal to the collector current of $Q_4$ 702 is determined by the area factor difference between $Q_3$ 701 and $Q_4$ 702. Hence, the larger $Q_4$ 702 is compared to $Q_3$ 701, the larger the RF voltage necessary at the base of $Q_3$ 701 to achieve equal collector currents. As the RF voltage is increased further, the collector current of $Q_3$ 701 will exceed that of $Q_4$ 702, resulting in a current mirrored from $Q_5$ 704 to $Q_6$ 705, that is again partially mirrored by $Q_7$ 706, and reflected as a sink current through $Q_8$ 703 from the loading diode 603. The result is a sink current present at $Q_8$ 703 that is proportional to the detected RF voltage present at the base of $Q_3$ 701.

Concerning the quiescent DC operating point of feed-forward load control 601 circuit, the supply voltage 516 of substantially one volt DC powers the circuit. Resistors $R_8$ 707, $R_9$ 708, $R_{10}$ 709, $R_{11}$ 710, and $R_{12}$ 711, operate to set the steady state DC bias for proper operation. As with a symmetric differential amplifier, the right and left half components essentially mirror each other's values. In the instant case, this is true for all components except for the transistors, $Q_3$ 701 and $Q_4$ 702, as discussed before. Capacitor $C_7$ 712 operates as an AC coupling impedance to allow detection of the input signal level received at the radio frequency amplifier 202. Capacitor $C_8$ 713 operates as an RF bypass capacitor, making the performance of the feed-forward load control 601 circuit substantially independent of frequency.

In summary, the embodiment described above uses a selective call receiver 100 such as illustrated in FIG. 1 including a radio frequency amplifier 202, having an output power level that is controllable. The receiver operates to provide a received signal, and comprises a loading diode 603 coupled to an output of the radio frequency amplifier 202. A feed-forward load control 601 is coupled to an input of the radio frequency amplifier 202 for detecting an input signal level and regulating conduction of a current through the loading diode 603 in response to the input signal level substantially reaching or exceeding a predetermined activation threshold corresponding with a predetermined input signal level and a maximum output power level, the current causing an impedance of the loading diode 603 to vary in a manner that causes the output power level to remain substantially constant.

More specifically, the feed-forward load control 601 comprises a single ended input, single ended output, differential amplifier. The feed-forward load control 601 operates in a first state when the input signal level received at the radio frequency amplifier 202 is below the predetermined activation threshold such that a differential half is biased in a first asymmetric direction resulting in no conduction of the current through the loading diode 603, thus allowing the Output power level to substantially track the received input signal level. In a second state, when the input signal level received at the radio frequency amplifier 202 substantially reaches or exceeds the predetermined signal overload level such that a differential half is biased in a second asymmetric direction resulting in conduction of the current through the loading diode 603, thus effecting adjustment of the power gain of the radio frequency amplifier 202 to maintain a substantially constant radio frequency amplifier output power level.

Moreover, as earlier discussed, the amplifier output power level adjustment circuit 403 may be further responsive to a relative strength indication of a received on-channel signal (shown as the RSSI signal in FIGS. 2, 3, 4, 6, and 7), the amplifier output power level adjustment circuit operating to adjust the power gain of the radio frequency amplifier 202 such that the output power level remains substantially constant when the received on-channel signal substantially reaches or exceeds a predetermined signal overload level.

Finally, for matters of convenience, the radio frequency amplifier 202, the loading diode 603, and the feed-forward load control 601 may be fabricated in an integrated circuit.

What is claimed is:

1. A selective call receiver including a radio frequency amplifier having an output power level that is controllable, the selective call receiver further including a received signal strength indicator that generates an RSSI signal having a magnitude proportional to an on-channel signal received at the radio frequency amplifier and recovered by the selective call receiver, the RSSI signal serving to indicate a relative strength of the received on-channel signal, the selective call receiver comprising:

a radio frequency level sensor that generates a sensor output signal in response to an input signal level received at the radio frequency amplifier, the input signal level including the on-channel signal; and an amplifier output power level adjustment circuit responsive to the sensor output signal and the RSSI signal, the amplifier output power level adjustment circuit operating to adjust a power gain of the radio frequency amplifier in an unconditionally stable feed-forward manner responsive to the sensor output signal and further in response to the RSSI signal such that the output power level remains substantially constant when a received input signal level sensed by the radio frequency level sensor substantially reaches or exceeds a first predetermined signal overload level or the received on-channel signal substantially reaches or exceeds a second predetermined signal level.

2. The selective call receiver according to claim 1 wherein the radio frequency level sensor comprises:

at least one filter coupled to the radio frequency level sensor, the at least one filter operating to condition the sensor output signal having a spectral content comprising complex periodic and non-periodic components such that a filter output signal is generated representing an effective value of the input signal level received at the radio frequency amplifier.

3. The selective call receiver according to claim 2 wherein the at least one filter comprises a low-pass filter.

4. The selective call receiver according to claim 2 wherein the radio frequency amplifier, the radio frequency level sensor and the amplifier output power level adjustment circuit are fabricated in an integrated circuit.

5. The selective call receiver according to claim 4 wherein the integrated circuit is fully operational when powered by a supply voltage of substantially one volt DC.

6. The selective call receiver according to claim 1 wherein the radio frequency level sensor comprises:

a single ended input, differential output amplifier having differential halves, the radio frequency level sensor operating:

in a first state when the input signal level received at the radio frequency amplifier is below the first predetermined signal overload level such that a differential half is biased in a first asymmetric direction resulting in no adjustment of the output power level, thus allowing the output power level to substantially track the received input signal level; and in a second state when the input signal level received at the radio frequency amplifier substantially reaches or exceeds the first predetermined signal overload level such that a differential half is biased in a second asymmetric direction resulting in a differential output signal that effects adjustment of the power gain of the radio frequency amplifier to maintain a substantially constant radio frequency amplifier output power level.

7. The selective call receiver according to claim 1 wherein the amplifier output power level adjustment circuit comprises:

a loading diode coupled to an output of the radio frequency amplifier.

8. The selective call receiver according to claim 7 wherein the radio frequency level sensor comprises:

a feed-forward level limiter coupled to an input of the radio frequency amplifier for detecting the input signal level and generating the sensor output signal that regulates conduction of a current through the loading diode in response to the input signal level substantially reaching or exceeding a predetermined activation threshold corresponding with the first predetermined signal overload level and a maximum output power level, the current causing an impedance of the loading diode to vary in a manner that causes the output power level of the radio frequency amplifier to remain substantially constant.

9. The selective call receiver according to claim 8 wherein the radio frequency amplifier, the loading diode, and the feed-forward level limiter are fabricated in an integrated circuit.

10. The selective call receiver according to claim 8 wherein the feed-forward level limiter comprises:

a single ended input, single ended output, differential amplifier, the feed-forward level limiter operating:

in a first state when the input signal level received at the radio frequency amplifier is below the predetermined activation threshold such that a differential half is biased in a first asymmetric direction resulting in no conduction of the current through the loading diode, thus allowing the output power level to substantially track the received input signal level; and in a second state when the input signal level received at the radio frequency amplifier substantially reaches or exceeds the first predetermined signal overload level such that a differential half is biased in a second asymmetric direction resulting in conduction of the current through the loading diode, thus effecting adjustment of the power gain of the radio frequency amplifier to maintain a substantially constant radio frequency amplifier output power level.

11. The selective call receiver according to claim 1 further comprising:

a receiver including the radio frequency amplifier with controllable output power;

a demodulator coupled to the receiver for recovering a received signal and providing an information signal;

a decoder for correlating a recovered address contained within the information signal with a predetermined address corresponding to the selective call receiver, and responsive to said recovered and predetermined addresses substantially correlating, generating a detection indicating selection of the selective call receiver; and a support circuit to process information recovered from the information signal for presentation in response to the detection indicating selection of the selective call receiver.

12. A selective call receiver, comprising:

a receiver including a radio frequency amplifier having an output power level that is controllable, the receiver operating to provide a received signal, the receiver comprising:

a received signal strength indicator that generates an RSSI signal having a magnitude proportional to an on-channel signal received at the radio frequency amplifier and recovered by the selective call receiver, the RSSI signal serving to indicate a relative strength of the received on-channel signal;

a radio frequency level sensor that generates a sensor output signal in response to an input signal level received at the radio frequency amplifier, the input signal level including the on-channel signal; and an amplifier output power level adjustment circuit responsive to the sensor output signal and the RSSI signal, the amplifier output power level adjustment circuit operating to adjust a power gain of the radio frequency amplifier in an unconditionally stable feed-forward manner responsive to the sensor output signal and further in response to the RSSI signal such that the output power level remains substantially constant when a received input signal level sensed by the radio frequency level sensor substantially reaches or exceeds a first predetermined signal overload level or the received on-channel signal substantially reaches or exceeds a second predetermined signal level;

a demodulator for recovering the received signal and providing an information signal;

a decoder for correlating a recovered address contained within the information signal with a predetermined address corresponding to the selective call receiver, and responsive to said recovered and predetermined addresses substantially correlating, generating a detection indicating selection of the selective call receiver; and a support circuit to process information recovered from the information signal for presentation in response to the detection indicating selection of the selective call receiver.

13. The selective call receiver according to claim 12 wherein the radio frequency level sensor comprises:

at least one filter coupled to the radio frequency level sensor, the at least one filter operating to condition the sensor output signal having a spectral content comprising complex periodic and non-periodic components such that a filter output signal is generated representing an effective value of the input signal level received at the radio frequency amplifier.

14. The selective call receiver according to claim 13 wherein the at least one filter comprises a low-pass filter.

15. The selective call receiver according to claim 12 wherein the radio frequency level sensor comprises:

a single ended input, differential output amplifier having differential halves, the radio frequency level sensor operating:

in a first state when the input signal level received at the radio frequency amplifier is below the first predetermined signal overload level such that a differential half is biased in a first asymmetric direction resulting in no adjustment of the output power level, thus allowing the output power level to substantially track a received input signal level; and in a second state when the input signal level received at the radio frequency amplifier substantially reaches or exceeds the first predetermined signal overload level such that a differential half is biased in a second asymmetric direction resulting in a differential output signal that effects adjustment of the power gain of the radio frequency amplifier to maintain a substantially constant radio frequency amplifier output power level.

16. The selective call receiver according to claim 12 wherein the amplifier output power level adjustment circuit comprises:

a loading diode coupled to an output of the radio frequency amplifier.

17. The selective call receiver according to claim 16 wherein the radio frequency level sensor comprises:

a feed-forward level limiter coupled to the input of the radio frequency amplifier for detecting the input signal level and generating the sensor output signal that regulates conduction of a current through the loading diode in response to the input signal level substantially reaching or exceeding a predetermined activation threshold corresponding with the first predetermined signal overload level and a maximum output power level, the current causing an impedance of the loading diode to vary in a manner that causes the output power level of the radio frequency amplifier to remain substantially constant.

18. The selective call receiver according to claim 17 wherein the feed-forward level limiter comprises:

a single ended input, single ended output, differential amplifier, the feed-forward level limiter operating:

in a first state when the input signal level received at the radio frequency amplifier is below the predetermined activation threshold such that a differential half is biased in a first asymmetric direction resulting in no conduction of the current through the loading diode, thus allowing the output power level to substantially track the received input signal level; and in a second state when the input signal level received at the radio frequency amplifier substantially reaches or exceeds the first predetermined signal overload level such that a differential half is biased in a second asymmetric direction resulting in conduction of the current through the loading diode, thus effecting adjustment of the power gain of the radio frequency amplifier to maintain a substantially constant radio frequency amplifier output power level.

19. The selective call receiver according to claim 12 wherein the radio frequency amplifier, radio frequency level sensor, and amplifier output power level adjustment circuit are fabricated in a single integrated circuit.

\* \* \* \* \*